United States Patent
Lai et al.

(10) Patent No.: US 10,818,816 B2
(45) Date of Patent: Oct. 27, 2020

(54) OPTICAL DEVICE WITH DECREASED INTERFERENCE

(71) Applicant: Advanced Semiconductor Engineering, Inc., Kaohsiung (TW)

(72) Inventors: Lu-Ming Lai, Kaohsiung (TW); Shih-Chieh Tang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 28 days.

(21) Appl. No.: 15/821,302

(22) Filed: Nov. 22, 2017

(65) Prior Publication Data
US 2019/0157492 A1  May 23, 2019

(51) Int. Cl.
| | |
|---|---|
| *H01L 27/146* | (2006.01) |
| *H01L 31/0232* | (2014.01) |
| *H01L 31/105* | (2006.01) |
| *H01L 31/173* | (2006.01) |
| *H01L 27/15* | (2006.01) |
| *H01L 31/02* | (2006.01) |
| *G06K 9/00* | (2006.01) |
| *H01L 33/20* | (2010.01) |

(52) U.S. Cl.
CPC ........ *H01L 31/173* (2013.01); *G06K 9/00013* (2013.01); *H01L 27/14678* (2013.01); *H01L 27/156* (2013.01); *H01L 31/02005* (2013.01); *H01L 31/02327* (2013.01); *H01L 31/105* (2013.01); *H01L 33/20* (2013.01)

(58) Field of Classification Search
CPC ............. H01L 31/173; H01L 31/02005; H01L 31/02327; H01L 27/14678; H01L 27/156
See application file for complete search history.

(56) References Cited

U.S. PATENT DOCUMENTS

| | | | | |
|---|---|---|---|---|
| 5,574,744 | A * | 11/1996 | Gaw ................... | G02B 6/12004 257/E31.109 |
| 6,261,859 | B1 * | 7/2001 | Ouchi .................... | B82Y 20/00 257/E27.12 |
| 8,791,470 | B2 | 7/2014 | Wober | |
| 9,570,002 | B2 | 2/2017 | Sakariya et al. | |
| 2002/0153529 | A1 * | 10/2002 | Shie ...................... | H01L 27/156 257/88 |

(Continued)

OTHER PUBLICATIONS

Office Action from Corresponding Taiwan Patent Application No. 107104417, dated Aug. 3, 2020, 6 pages, with English summary.

(Continued)

*Primary Examiner* — Allen L Parker
*Assistant Examiner* — Gustavo G Ramallo
(74) *Attorney, Agent, or Firm* — Foley & Lardner LLP

(57) ABSTRACT

An optical device includes a substrate, a plurality of light emitting devices, a photo detector and a circuit layer. The substrate has a first surface and a second surface opposite to the first surface. The substrate includes a first region and a second region. The light emitting devices are disposed on the first surface in the first region of the substrate. The photo detector is disposed in the second region of the substrate. The photo detector includes an electrical contact exposed from the second surface of the substrate. The circuit layer is disposed on the second surface of the substrate and electrically connected to the electrical contact of the photo detector.

26 Claims, 11 Drawing Sheets

(56) References Cited

U.S. PATENT DOCUMENTS

| | | | |
|---|---|---|---|
| 2004/0142539 A1* | 7/2004 | Koizumi | H01L 27/14618 |
| | | | 438/455 |
| 2007/0063647 A1* | 3/2007 | Yu | H01L 25/0753 |
| | | | 313/512 |
| 2008/0142686 A1* | 6/2008 | Konno | H01L 27/14632 |
| | | | 250/208.1 |
| 2010/0308212 A1 | 12/2010 | Tanaka et al. | |
| 2012/0199812 A1* | 8/2012 | Baykan | H01L 31/03527 |
| | | | 257/13 |
| 2016/0118529 A1* | 4/2016 | Leobandung | H01L 31/105 |
| | | | 438/24 |
| 2016/0266721 A1 | 9/2016 | Kurokawa et al. | |
| 2016/0343780 A1 | 11/2016 | Guo et al. | |
| 2017/0078513 A1 | 3/2017 | Chang et al. | |
| 2018/0066982 A1* | 3/2018 | Peng | G01J 1/0407 |
| 2019/0095671 A1* | 3/2019 | Yeke Yazdandoost | |
| | | | G06K 9/0004 |

OTHER PUBLICATIONS

Search Report from Corresponding Taiwan Patent Application No. 107104417, dated Aug. 3, 2020, 1 page.

* cited by examiner

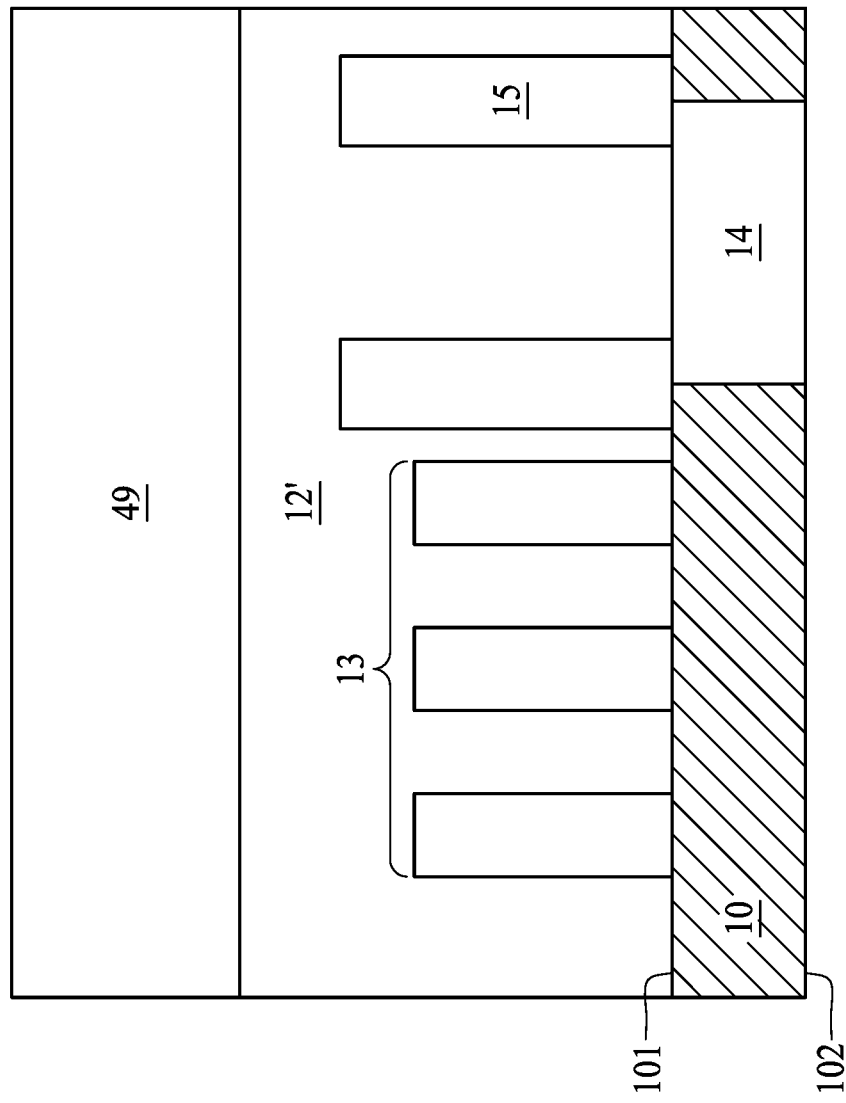

OPTICAL DEVICE WITH DECREASED INTERFERENCE

BACKGROUND

1. Technical Field

The present disclosure relates to an optical device and a method for manufacturing the same.

2. Description of the Related Art

Some display panels can be categorized into liquid-crystal display (LCD) type display panels or organic light-emitting diode (OLED) type display panels. However, neither the LCD display panel nor the OLED display panel can achieve full-color light display. In addition, to achieve "full-screen display," it can be desirable to integrate a fingerprint identification module into a display. However, it is challenging to achieve such integration due to interference or cross-talk between a light emitting device and a photo detector included in such devices.

SUMMARY

In accordance with an aspect of the present disclosure, an optical device includes a substrate, a plurality of light emitting devices, a photo detector and a circuit layer. The substrate has a first surface and a second surface opposite to the first surface. The substrate includes a first region and a second region. The light emitting devices are disposed on the first surface in the first region of the substrate. The photo detector is disposed in the second region of the substrate. The photo detector includes an electrical contact exposed from the second surface of the substrate. The circuit layer is disposed on the second surface of the substrate and electrically connected to the electrical contact of the photo detector.

In accordance another aspect of the present disclosure, a display device includes a substrate, a pixel, a photo diode and a circuit layer. The substrate includes a first region and a second region. The pixel is disposed at the first region of the substrate. The pixel includes a plurality of nanowire LEDs. The photo diode is disposed at the second region of the substrate and adjacent to the pixel. The circuit layer is electrically connected to the nanowire LEDs and the photo diode.

In accordance another aspect of the present disclosure, a method of manufacturing a display device includes (a) forming a plurality of nanowire LEDs on a top surface of a substrate; (b) forming a plurality of photo diodes within the substrate, wherein a thickness of each of the photo diodes is substantially the same as a thickness of the substrate; and (c) forming a circuit layer that is electrically connected to the nanowire LEDs and the photo diodes.

BRIEF DESCRIPTION OF THE DRAWINGS

FIG. 4A, FIG. 4B, FIG. 4C, FIG. 4D, FIG. 4E, FIG. 4F and FIG. 4G illustrate one or more stages of a method for manufacturing an optical device in accordance with some embodiments of the present disclosure.

Figure 1A:
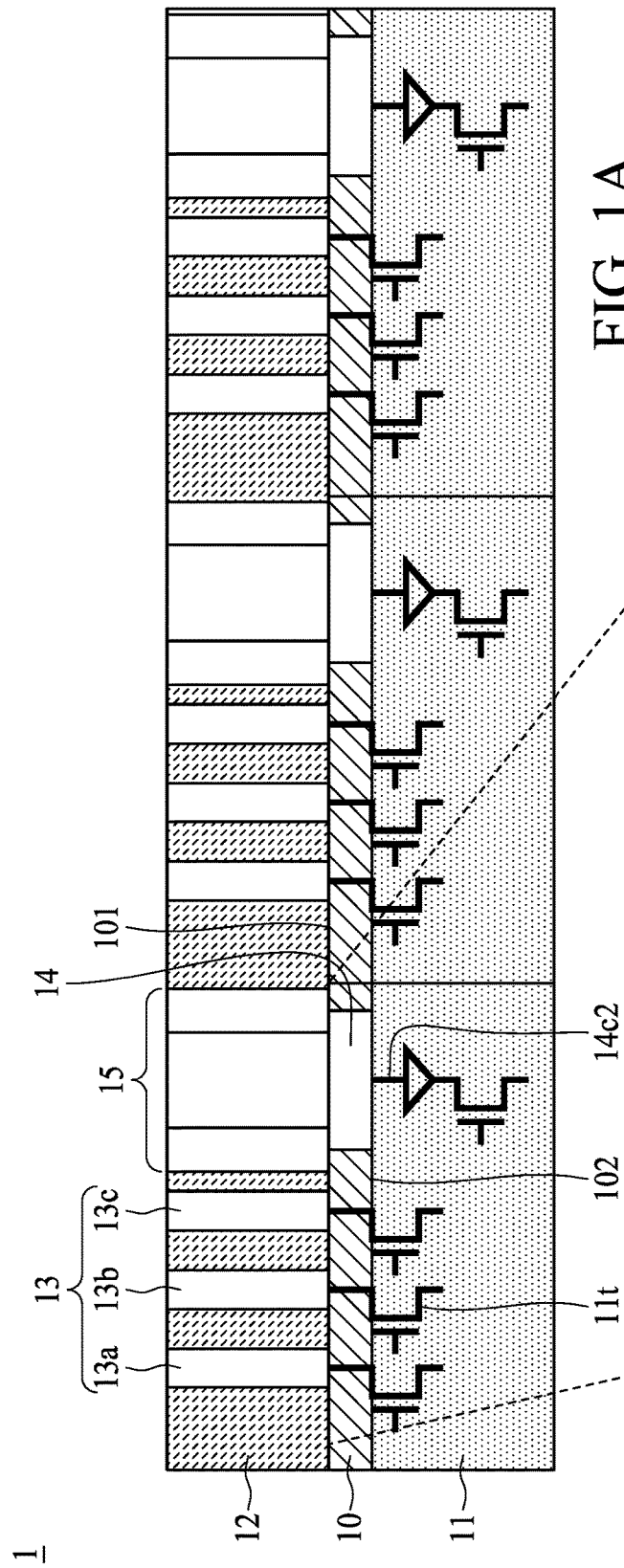
FIG. 1A illustrates a cross-sectional view of an optical device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1A illustrates a cross-sectional view of some embodiments of an optical device 1 in accordance with some embodiments of the present disclosure. The optical device 1 includes a substrate 10, a circuit layer 11, a protection layer 12, light emitting devices 13, a photo detector 14 and a collimator 15.

In some embodiments, the substrate 10 includes a silicon carbide (SiC) substrate, a sapphire substrate or a silicon substrate. The substrate 10 also includes a heterojunction formed between two different semiconductor material layers, such as material layers with different band gaps. For example, the semiconductor structure 10 includes a non-doped narrow-band gap channel layer and a wide-band gap n-type donor-supply layer. The substrate 10 has a top surface 101 (also referred to as "first surface") and a bottom surface 102 (also referred to as "second surface") opposite to the top surface 101. In some embodiments, the substrate 10 may include a first region on which the light emitting devices 13 are disposed and a second region adjacent to the first region for accommodating the photo detector 14.

Figure 1B:
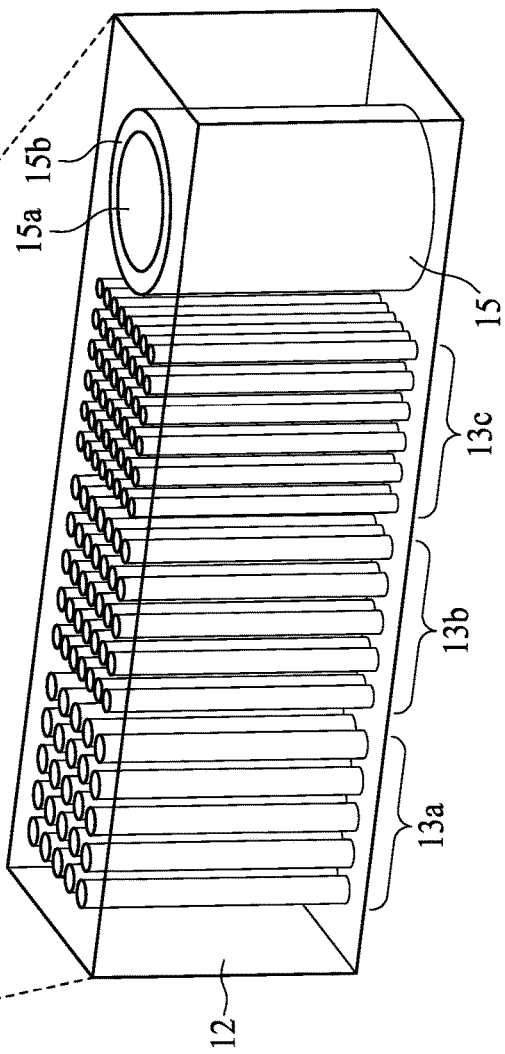
FIG. 1B illustrates a perspective view of an optical device in accordance with some embodiments of the present disclosure.

The light emitting devices 13 are disposed on the top surface 101 of the substrate 10. In some embodiments, the light emitting devices 13 are disclosed on the top surface 101 of the first region of the substrate 10. The light emitting devices 13 may include a plurality of emitting dies or other optical dies. For example, the light emitting devices 13 may include light-emitting diodes (LEDs), laser diodes, or other devices that may include one or more semiconductor layers. The semiconductor layers may include silicon, silicon carbide, gallium nitride, or any other semiconductor materials. In some embodiments, the light emitting devices 13 are red-green-blue (RGB) LEDs including at least one red LED 13a, at least one green LED 13b and at least one blue LED 13c. In some embodiments, as shown in FIG. 1B, which illustrates a perspective view of the light emitting devices 13 shown in FIG. 1A, the light emitting devices 13 include a plurality of red LEDs 13a, a plurality of green LEDs 13b and a plurality of blue LEDs 13c arranged in arrays (e.g. uniform arrays, or non-uniform arrays).

In some embodiments, the red LEDs 13a, the green LEDs 13b and the blue LEDs 13c correspond to, or define, a pixel, which is adjacent to the photo detector 14. For example, each pixel of the optical device 1 includes RGB LEDs. In some embodiments, the red LEDs 13a, the green LEDs 13b and the blue LEDs 13c are nanowire LEDs. A wavelength of a light emitted by a nanowire LED varies according to a width of the nanowire LED. Therefore, respective widths of the red LED 13a, the green LED 13b and the blue LED 13c are different from each other. The nanowire LEDs can include any semiconductor material, and suitable materials for the nanowire LEDs include but are not limited to: GaAs (e.g. p-type GaAs), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, and Si. Possible donor dopants for, for example, GaP inclde Si, Sn, Te, Se, S, or other donor dopants, and acceptor dopants for GaP include Zn, Fe, Mg, Be, Cd, or other acceptor dopants. The nanowire LEDs provide for use of nitrides such as GaN, InN and AlN, which can facilitate fabrication of LEDs emitting light in wavelength regions not easily accessible by some comparative techniques. In some embodiments, a nanowire LED has an aspect ratio (corresponding to a ratio of its length to its width) of about 3 or greater, about 4 or greater, about 5 or greater, or about 10 or greater.

The photo detector 14 is disposed within the substrate 10. In some embodiments, the photo detector 14 is disposed within the second region of the substrate 10. In some embodiments, the photo detector 14 is for example, a PIN diode, a photo-diode, or a photo-transistor. In some embodiments, the photo detector 14 includes an electrical contact 14c2 exposed from, or protruding from, the bottom surface 102 of the substrate 10. In some embodiments, the photo detector 14 includes a photo diode.

Figure 1C:
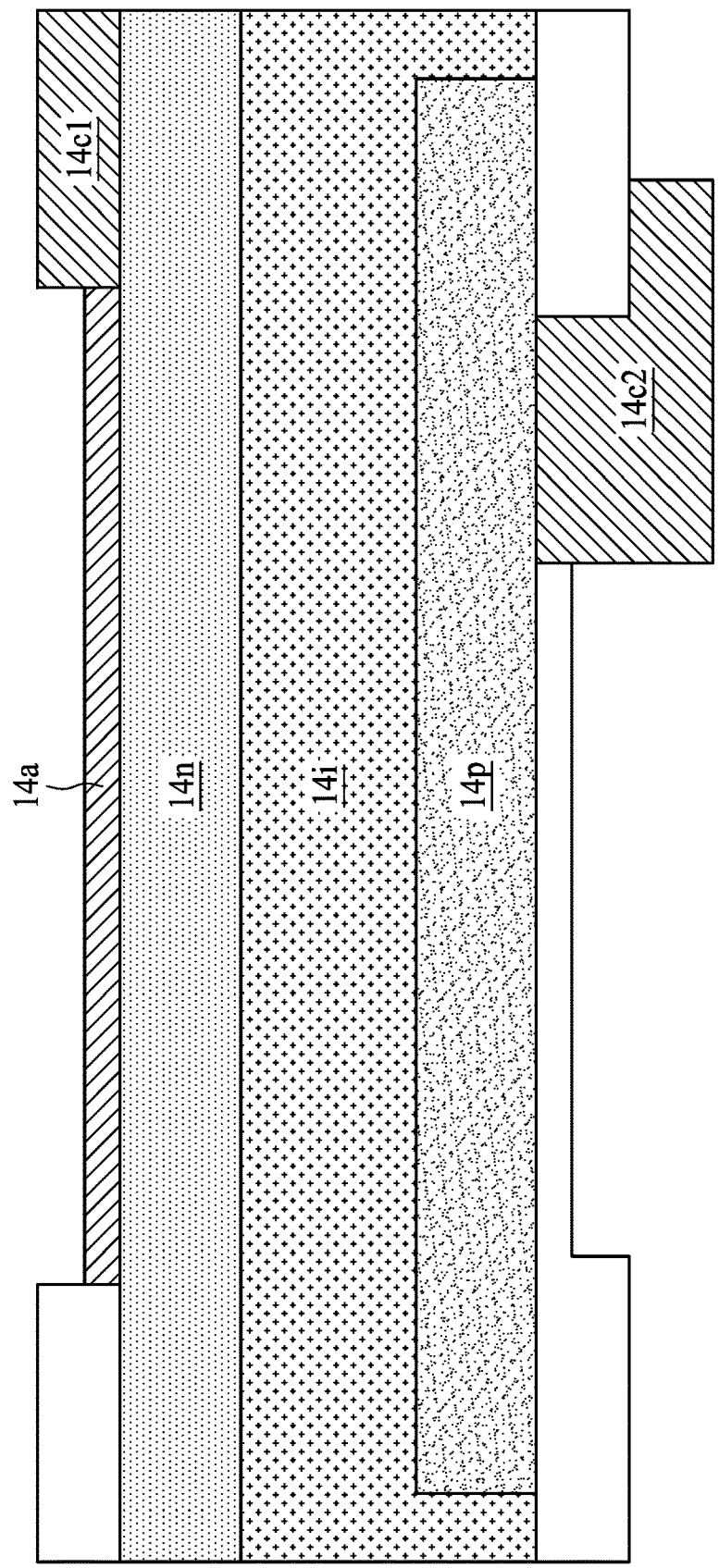
FIG. 1C illustrates a cross-sectional view of a photo detector in accordance with some embodiments of the present disclosure.

FIG. 1C illustrates an enlarged view of the photo detector 14 shown in FIG. 1A in accordance with some embodiments of the present disclosure. As shown in FIG. 1C, the photo detector 14 is a PIN diode including a p-type semiconductor region 14p, an intrinsic semiconductor region 14i (or active region) and an n-type semiconductor region 14n. In some embodiments, the n-type semiconductor region 14n is adjacent to the top surface 101 of the substrate 10, the p-type semiconductor region 14p is adjacent to the bottom surface 102 of the substrate 10 and the intrinsic semiconductor region 14i is sandwiched between the n-type semiconductor region 14n and the p-type semiconductor region 14p. Alternatively, the n-type semiconductor region 14n is adjacent to the bottom surface 102 of the substrate 10 and the p-type semiconductor region 14p is adjacent to the top surface 101 of the substrate 10 depending on design specifications. In some embodiments, a thickness of the photo detector 14 is substantially the same as a thickness of the substrate 10. In some embodiments, the thickness of the substrate 10 is about 3 micrometers (μm).

In some embodiments, the substrate 10 and the n-type semiconductor region 14n include a same doping type. Alternatively, the substrate 10 and the p-type semiconductor region 14p include a same doping type. In some embodiments, a thickness of the n-type semiconductor region 14n is less than that of the p-type semiconductor region 14p or the intrinsic semiconductor region 14i (e.g. the thickness of the n-type semiconductor region 14n is less than or equal to about 0.95 times that of the p-type semiconductor region 14p or the intrinsic semiconductor region 14i, less than or equal to about 0.90 times that of the p-type semiconductor region 14p or the intrinsic semiconductor region 14i, or less than or equal to about 0.85 times that of the p-type semiconductor region 14p or the intrinsic semiconductor region 14i). In some embodiments, a width of the p-type semiconductor region 14p is substantially equal to or less than that of the n-type semiconductor region 14n (e.g. the width of the p-type semiconductor region is less than or equal to about 0.95 times that of the n-type semiconductor region 14n or the intrinsic semiconductor region 14i, less than or equal to about 0.90 times that of the n-type semiconductor region 14n or the intrinsic semiconductor region 14i, or is less than or equal to about 0.85 times that of the n-type semiconductor region 14n or the intrinsic semiconductor region 14i). In some embodiments, the photo detector 14 may include an electrical contact 14c1 adjacent to the n-type semiconductor region 14n and an electrical contact 14c2 adjacent to the p-type semiconductor region 14p to provide electrical connection. In some embodiments, the photo detector 14 may include an anti-reflection (AR) coating 14a on the n-type semiconductor region 14n to help prevent at least some of the light emitted toward the photo detector 14 (e.g. received and transmitted by the photodetector 14) from reflecting.

In accordance with one or more embodiments shown in FIG. 1A, by growing nanowire LEDs on the silicon substrate 10 using an epitaxy technique to provide three-dimensional (3D) quantum confinement, a full-color light display can be achieved. In addition, since the photo detector 14 is built-in or embedded with a relatively thin substrate 10 (e.g., a substrate having a thickness of about 3 μm) on which the nanowire LEDs are grown, it is unnecessary to additionally place the photo detector on the substrate 10 by a pick and place technique, and implementing the built-in or embedded photo detector 14 can help to reduce a manufacturing cost and a total size of the optical device 1. Furthermore, to achieve "full-screen display," it can be desirable to integrate a fingerprint identification module into a display. As shown in FIG. 1A, by integrating both nanowire LEDs 13 and photo detector 14 into a single pixel of the optical device 1, the optical device 1 can achieve both the fingerprint identification and the full-color light display (e.g. simultaneously).

Referring back to FIG. 1A, the collimator 15 is disposed on the top surface 101 of the substrate 10 and over the photo detector 14. In some embodiments, as shown in FIG. 1B, the collimator 15 includes a light transmission element 15a and a light absorbing layer 15b disposed on a sidewall of the light transmission element 15a. In some embodiments, the light transmission element 15a includes a transparent resin layer. In some embodiments, the light absorbing layer 15b may include an ink, a photoresist, or a combination of two or more thereof. In the collimator 15, light reaching the sidewall the light transmission element 15a is absorbed by the light absorbing layer 15b so that cross talk or noise is reduced, and light propagating substantially in a direction of extension of the collimator 15 is selectively allowed to pass through the collimator 15. Such an arrangement improves an optical performance (e.g., for image recognition) of the photo detector 14.

The protection layer 12 is disposed on the top surface 101 of the substrate 10 to cover the light emitting devices 13, the collimator 15 and a portion of the photo detector 14. In some embodiments, the protection layer 12 is or may include a transparent molding compound.

The circuit layer 11 is disposed on the bottom surface 102 of the substrate 10. The circuit layer 11 may include an interconnection layer (e.g., a redistribution layer (RDL)) and a dielectric layer, and a first portion of the interconnection layer is covered or encapsulated by the dielectric layer while a second portion of the interconnection layer is exposed from the dielectric layer to provide electrical connections for the photo detector 14 and the light emitting devices 13. For example, the electrical contact 14c2 of the photo detector 14 exposed from the bottom surface 102 of the substrate 10 is electrically connected to the circuit layer 11. For example, the light emitting devices 13 are electrically connected to the circuit layer 11 through through-silicon vias (TSVs) within the substrate 10. In some embodiments, the circuit layer 11 may include a plurality of transistors 11t embedded therein, each electrically connected to a respective corresponding one of the light emitting devices 13.

Figure 2:
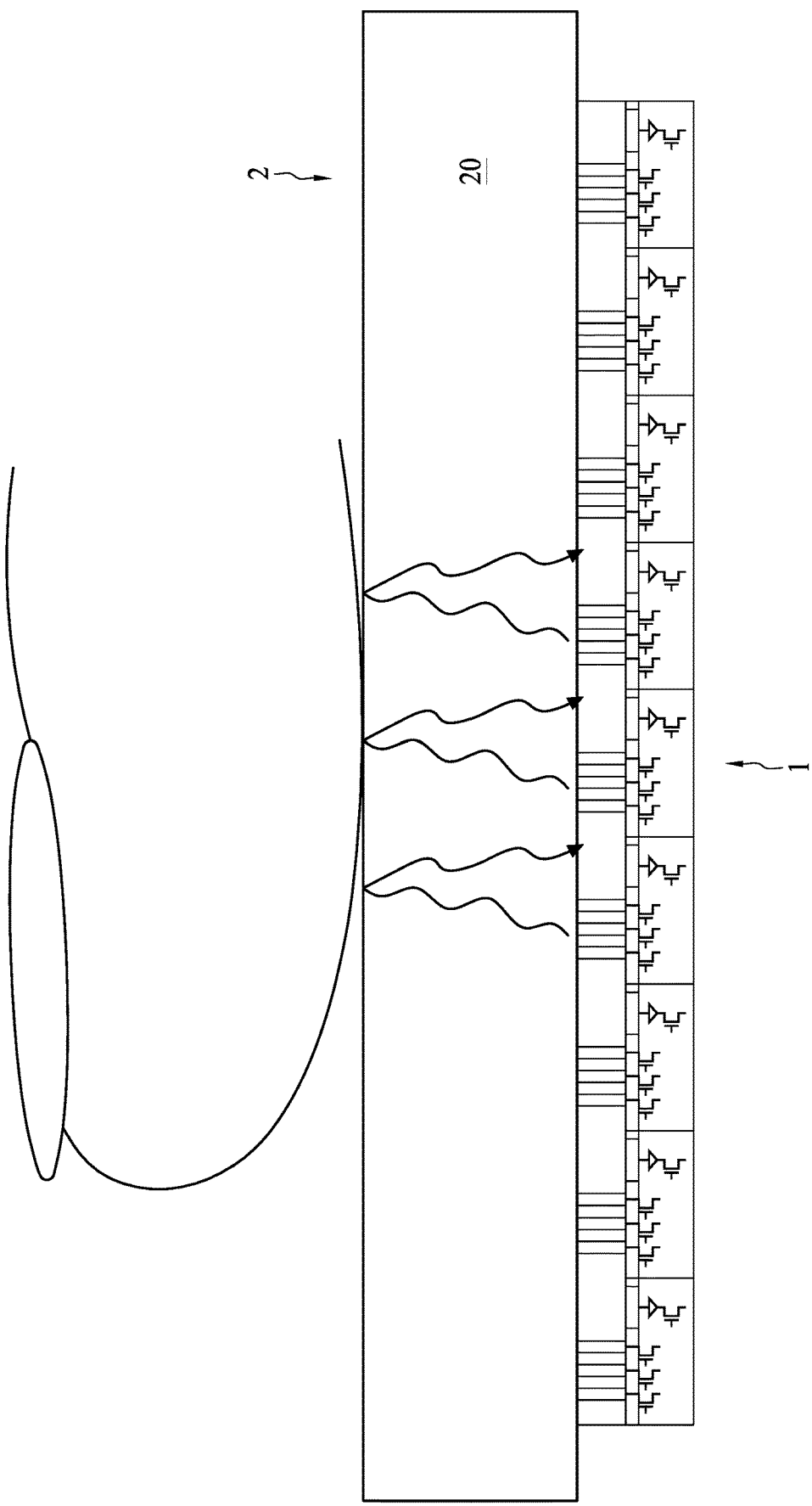
FIG. 2 illustrates a cross-sectional view of an optical system in accordance with some embodiments of the present disclosure.

FIG. 2 illustrates a cross-sectional view of an optical system 2 in accordance with some embodiments of the present disclosure. The optical system 2 includes the optical device 1 shown in FIG. 1A and a glass cover 20 (or other transparent cover). In some embodiments, the optical system 2 includes a plurality of optical devices 1. In some embodiments, the optical system 2 may be at least a portion of a display device, a cell phone, a tablet, a notebook, a display or any other suitable electronic components equipped with a screen and a fingerprint recognition module. As mentioned above, the nanowire LEDs of the optical device 1 can achieve the full-color light display. The light emitted by the nanowire LEDs of the optical device 1 is reflected by an object (e.g., a finger of the user) and then the reflected light is received or detected by the photo detector of the optical device 1 to achieve the function of fingerprint recognition. Therefore, the electronic component equipped with the optical system 2 can achieve both the fingerprint identification and the full-color light display (e.g. simultaneously).

Figure 3:
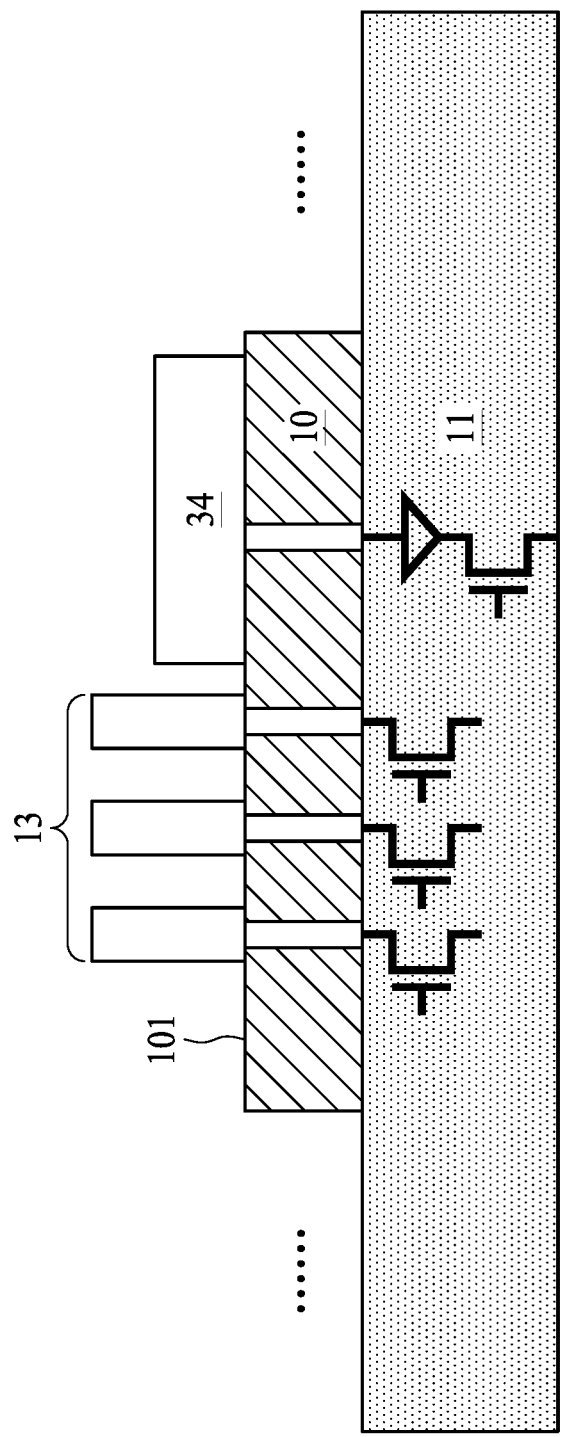
FIG. 3 illustrates a cross-sectional view of an optical device in accordance with some embodiments of the present disclosure.

FIG. 3 illustrates a cross-sectional view of an optical device 3 in accordance with some embodiments of the present disclosure. The optical device 3 is similar to the optical device 1 shown in FIG. 1A except that in FIG. 1A, a photo detector 14 is embedded or built-in within a substrate 10 while in FIG. 3, a photo detector 34 is disposed on a top surface 101 of the substrate 10.

FIG. 4A, FIG. 4B, FIG. 4C, FIG. 4D, FIG. 4E, FIG. 4F and FIG. 4G illustrate various stages of a method for manufacturing an optical device 1 as shown in FIG. 1A in accordance with some embodiments of the present disclosure. Although some processes, operations or stags are described in the following with respect to each of a plurality of components, any of those processes, operations or stages may be selectively performed with respect to one of the plurality of components, or with respect to some number in between one and the full plurality of components.

Figure 4A:
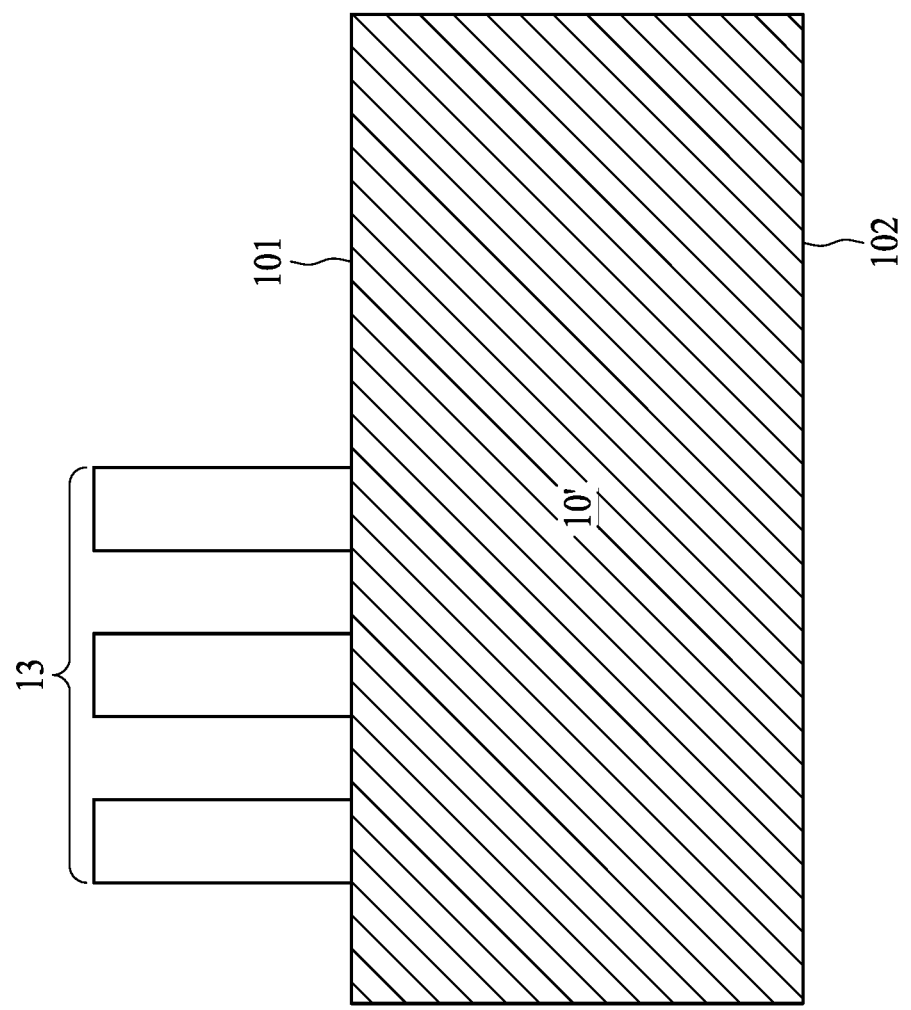

Referring to FIG. 4A, a substrate 10' is provided. The substrate 10' includes a SiC substrate, a sapphire substrate or a silicon substrate. A plurality of light emitting devices 13 are formed on the top surface 101 of the substrate 10'. In some embodiments, the light emitting devices 13 are grown on the top surface 101 of the substrate 10' by an epitaxy technique (e.g. epitaxial growth).

Figure 4B:
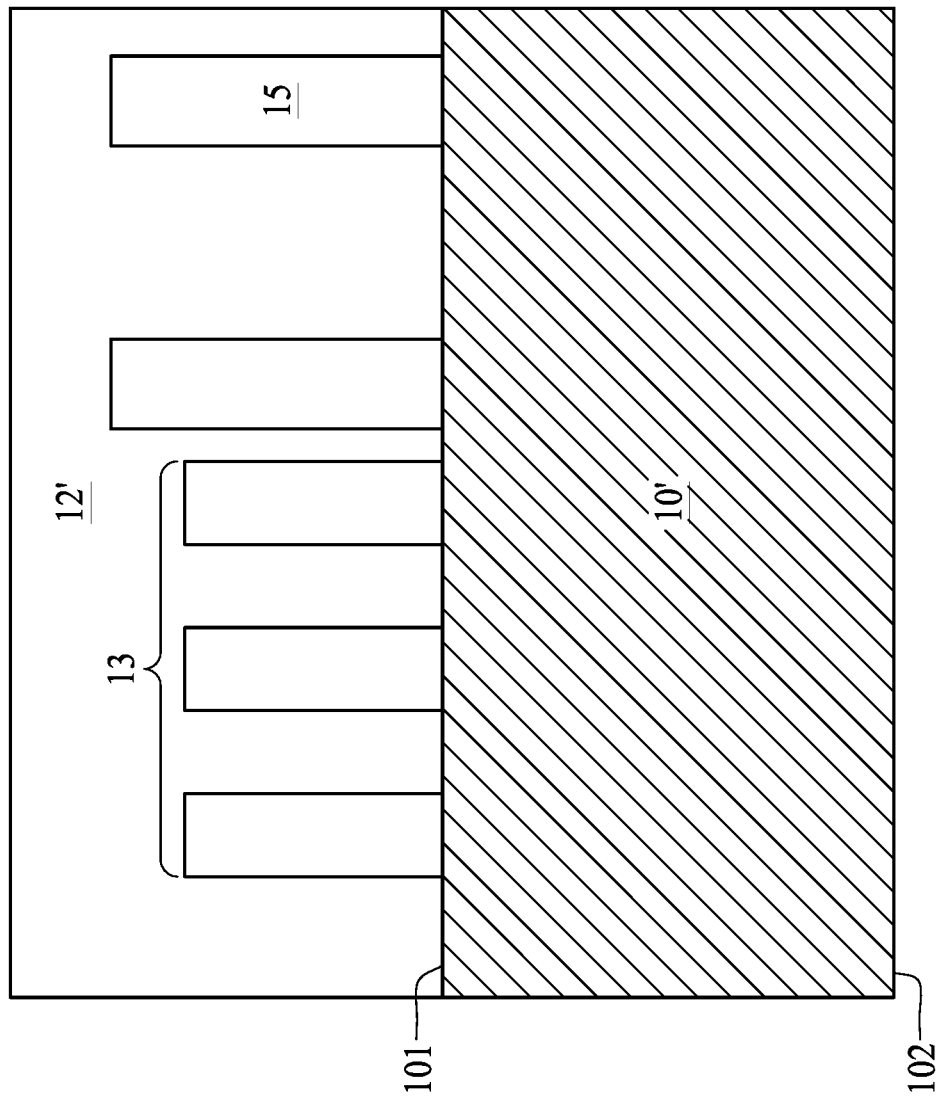

Referring to FIG. 4B, a collimator 15 is disposed on the top surface 101 of the substrate 10'. The collimator 15 is disposed adjacent to the light emitting devices 13. A protection layer 12' is then formed on the top surface 101 of the substrate 10' to cover the light emitting devices 13 and the collimator 15. In some embodiments, the protection layer 12' is formed by a molding technique, such as transfer molding or compression molding.

Figure 4C:
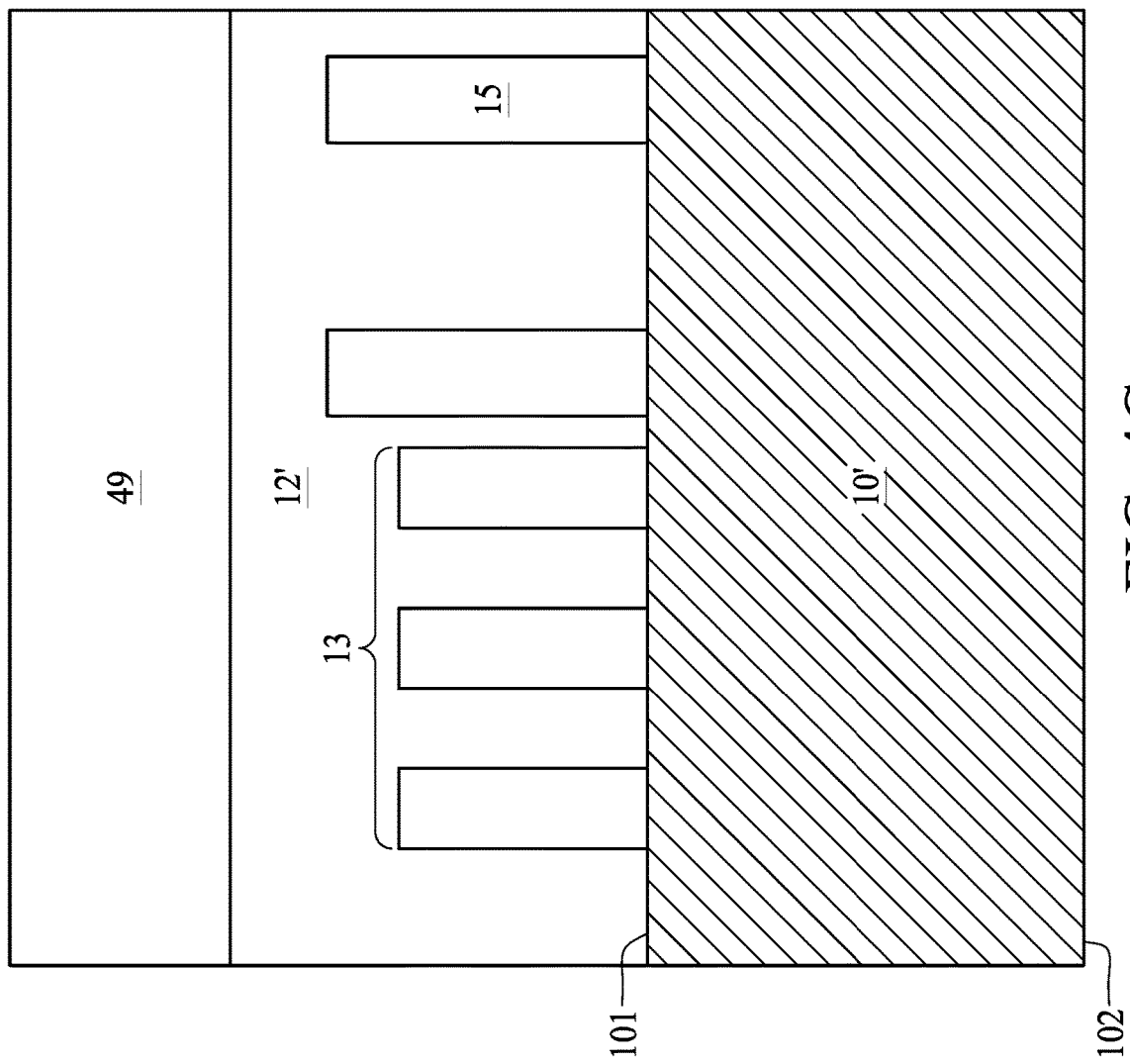

Referring to FIG. 4C, a carrier 49 is disposed on the protection layer 12' to provide a support in subsequent processes.

Figure 4D:
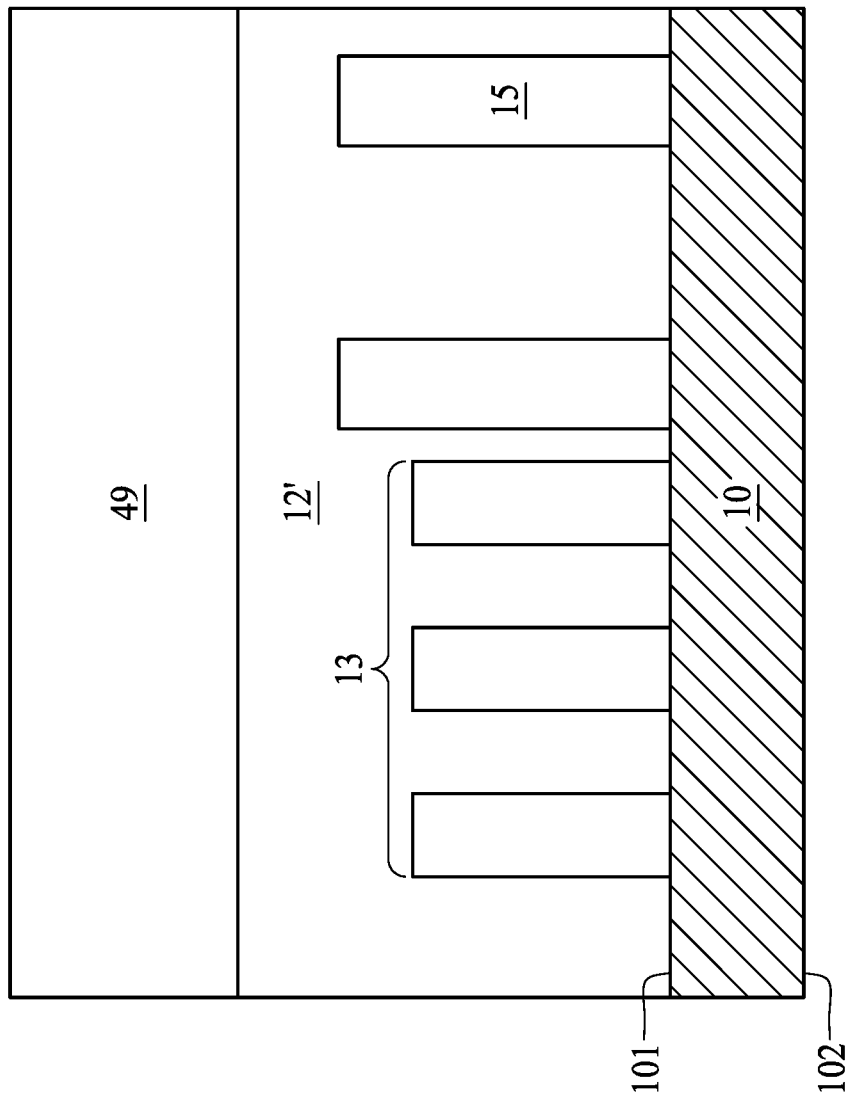

Referring to FIG. 4D, a portion of the substrate 10' is removed from the bottom surface 102 of the substrate 10' by, for example, a grinding technique, to form a thinner substrate 10. For example, a thickness of the substrate 10' is more than about 100 μm (e.g., in a range of about 200 μm to about 300 μm) while a thickness of the substrate 10 is less than about 5 μm (e.g., about 3 μm or less). The thinning operation of the substrate 10' may help to avoid a large aspect ratio of a TSV formed in the subsequent processes. In addition, the thinner substrate 10 may facilitate formation of a photo detector within the substrate 10 in the subsequent processes.

Referring to FIG. 4E, a photo detector 14 is formed within the substrate 10 and under the collimator 15. In some embodiments, photo detector 14 is formed by a doping process. For example, the photo detector can be formed by implanting dopant impurities (e.g. n-type impurities or p-type impurities) into the bottom surface 102 of the substrate 10 to form an n-type region and a p-type region. Doping may be done through ion implantation processes. When coupled with photolithographic processes, doping may be performed in selected areas by implanting atoms into exposed regions while other areas are masked. Also, a thermal drive or anneal cycles may be used to drive thermal diffusion to expand or extend a previously doped region. As alternatives, some epitaxial deposition of semiconductor materials allows for in-situ doping during the epitaxial deposition. Implantation can be done through certain materials, such as, for example, thin oxide layers. The doping concentration and the doping depth can be controlled or selected according to design specifications.

Figure 4F:
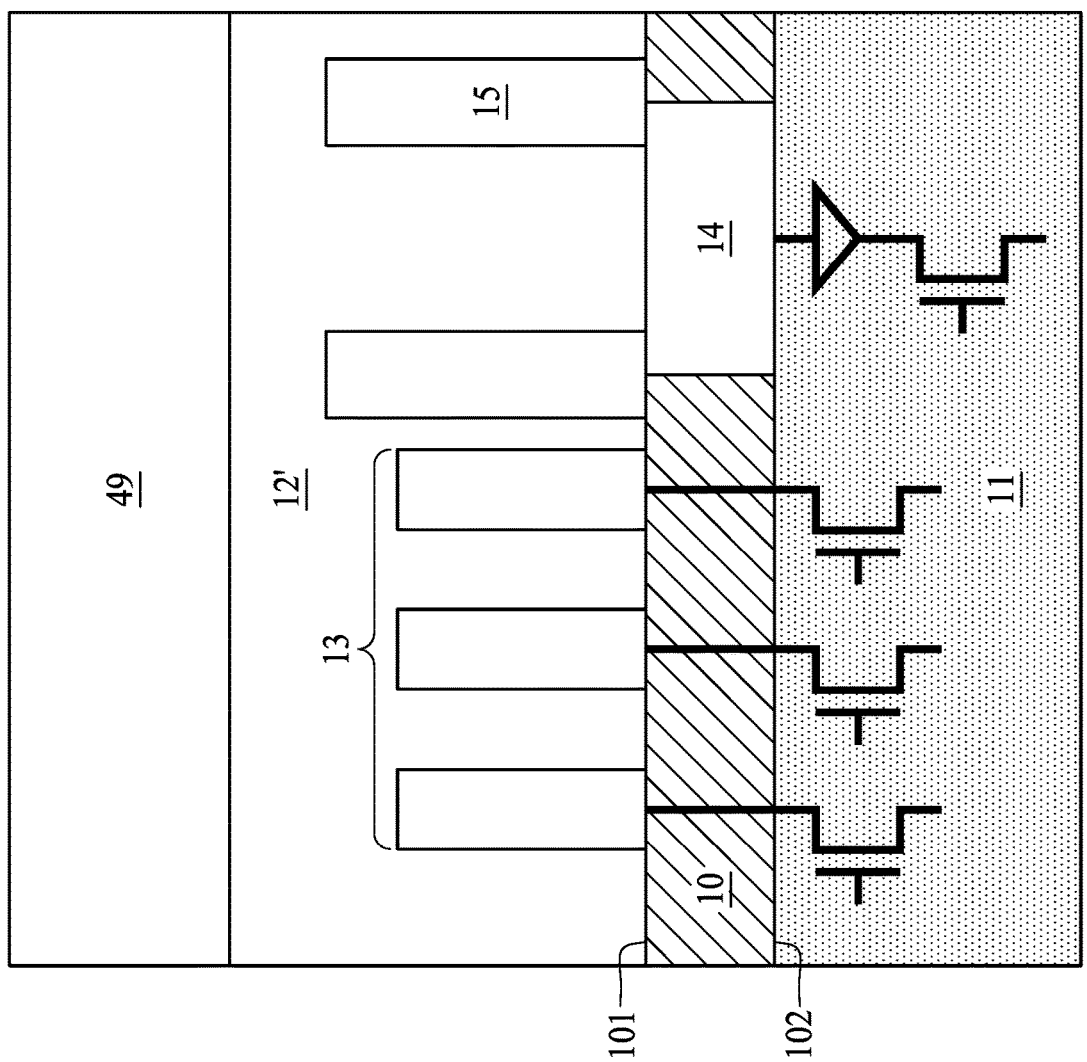

Referring to FIG. 4F, a circuit layer 11 is formed on the bottom surface 102 of the substrate 10 and electrically connected to the photo detector 14 and an electrical connection (e.g., one or more TSVs) within the substrate 10. In some embodiments, the circuit layer 11 can be formed by a lithographic technique. In some embodiments, the circuit layer 11 includes conductive wires and/or transistors covered or encapsulated by a passivation layer or dielectric layer. A portion of the conductive wires or transistors is exposed from the passivation layer or the dielectric layer to provide for electrical connections to the conductive wires or transistors.

Figure 4G:
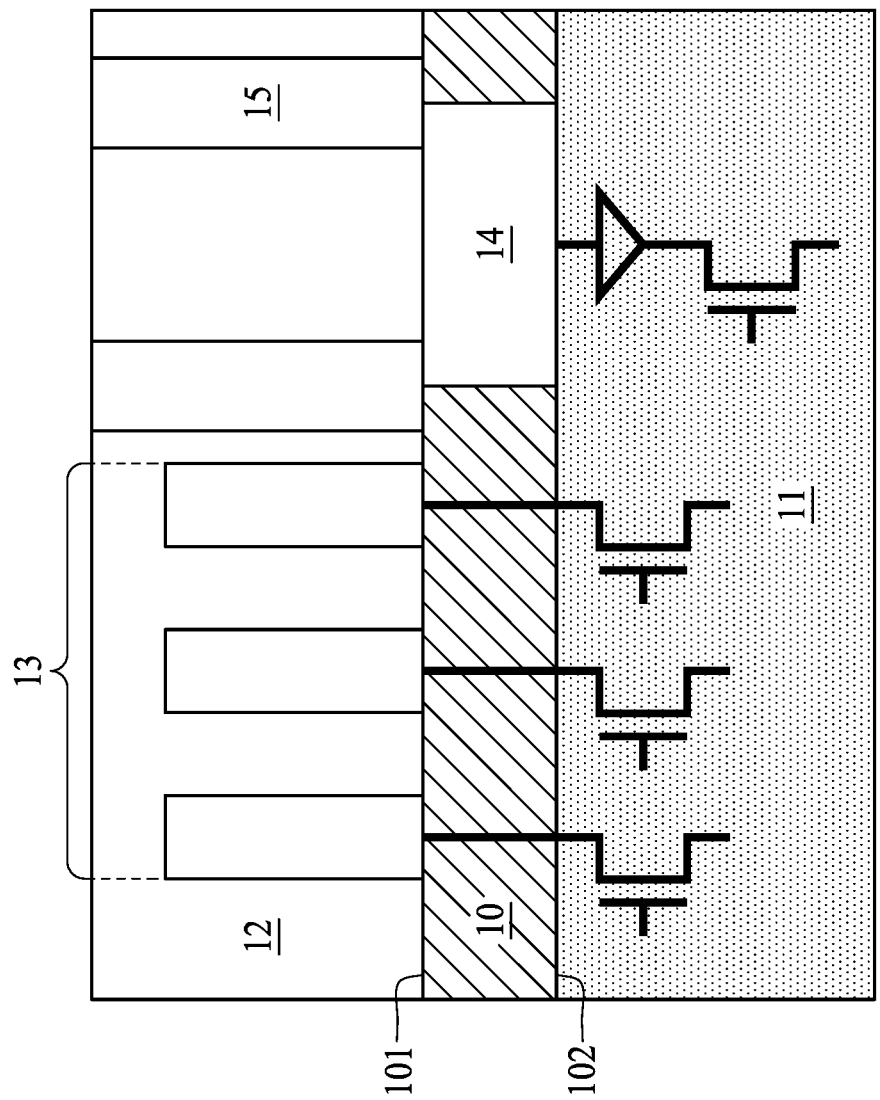

Referring to FIG. 4G, the carrier 49 is removed from the protection layer 12'. A portion of the protection layer 12' is then removed to expose a portion of the collimator 15 to form the optical device 1 as shown in FIG. 1A.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" coplanar can refer to two surfaces within 50 μm of lying along a same plane, such as within 40 μm, within 30 μm, within 20 μm, within 10 μm, or within 1 μm of lying along the same plane. For example, "substantially" aligned can refer to two components overlapping or being within 200 μm, within 150 μm, within 100 μm, within 50 μm, within 40 μm, within 30 μm, within 20 μm, within 10 μm, or within 1 μm of overlapping.

In the description of some embodiments, a component provided "on" or "over" another component can encompass cases where the former component is directly on (e.g., in physical contact with) the latter component, as well as cases where one or more intervening components are located between the former component and the latter component.

In the description of some embodiments, a component characterized as "light conducting," "light transmitting" or "transparent" can refer to such a component as having a light transmittance of at least 80%, such as at least 85% or at least 90%, over a relevant wavelength or a relevant range of wavelengths. In the description of some embodiments, a component characterized as "light shielding," "light blocking," or "opaque" can refer to such a component as having a light transmittance of no greater than 20%, such as no greater than 15% or no greater than 10%, over a relevant wavelength or a relevant range of wavelengths.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical device, comprising:
    a substrate having a first surface and a second surface opposite to the first surface, the substrate comprising a first region and a second region,
    a plurality of light emitting devices disposed on the first surface in the first region of the substrate;
    a photo detector disposed in the second region of the substrate and at a lateral side of the plurality of light emitting devices, the photo detector comprising an electrical contact exposed from the second surface of the substrate;
    a circuit layer disposed on the second surface of the substrate and electrically connected to the electrical contact of the photo detector; and
    a collimator disposed on the first surface in the second region of the substrate and over the photo detector, wherein the collimator comprises a light transmission element and a light absorbing layer disposed on a sidewall of the light transmission element.

2. The optical device of claim 1, wherein the photo detector is a PIN diode.

3. The optical device of claim 2, wherein the PIN diode includes a n-type region adjacent to the first surface of the substrate and a p-type region adjacent to the second surface of the substrate.

4. The optical device of claim 1, wherein the light transmission element includes a transparent resin layer.

5. The optical device of claim 1, further comprising a protection layer disposed on the first surface of the substrate and covering the light emitting devices.

6. The optical device of claim 1, wherein the substrate further comprises a through-silicon via (TSV) to electrically connect the light emitting devices to the circuit layer.

7. The optical device of claim 1, wherein the circuit layer comprises a plurality of transistors.

8. The optical device of claim 1, wherein the light emitting devices include a first light emitting diode (LED), a second LED and a third LED, and respective widths of the first LED, the second LED and the third LED are different from each other.

9. The optical device of claim 8, wherein the first LED, the second LED and the third LED comprise a pixel that is adjacent to the photo detector.

10. The optical device of claim 1, wherein the light emitting devices include a plurality nanowire LEDs.

11. The optical device of claim 1, wherein the substrate is a silicon substrate, and a thickness of the substrate is substantially the same as a thickness of the photo detector.

12. A display device, comprising:
    a substrate comprising a first region and a second region;
    a pixel disposed at the first region of the substrate, the pixel comprising a plurality of nanowire LEDs;
    a photo diode disposed at the second region of the substrate and adjacent to the pixel; and
    a circuit layer electrically connected to the nanowire LEDs and the photo diode;

wherein the substrate is a silicon substrate, and a thickness of the substrate is substantially the same as a thickness of the photo diode.

13. The display device of claim 12, further including:
a plurality of pixels disposed at the first region of the substrate including the pixel disposed at the first region of the substrate, each pixel comprising a plurality of nanowire LEDs; and
a plurality of photo diodes disposed at the second region of the substrate including the photo diode disposed at the second region of the substrate, wherein each photo diode is disposed adjacent to a corresponding one of the pixels.

14. The display device of claim 12, wherein the photo diode is disposed within the substrate.

15. The display device of claim 12, further comprising a collimator disposed over the photo diode.

16. The display device of claim 15, wherein the collimator comprises a light transmission element and a light absorbing layer surrounding the light transmission element.

17. The display device of claim 12, further comprising a protection layer disposed on the first region of the substrate and covering the pixel.

18. The display device of claim 12, wherein the nanowire LEDs extend away from the substrate.

19. An optical device, comprising:
a substrate having a first surface and a second surface opposite to the first surface, the substrate comprising a first region and a second region,
a plurality of light emitting devices disposed on the first surface in the first region of the substrate;
a photo detector disposed in the second region of the substrate and at a lateral side of the plurality of light emitting devices, the photo detector comprising an electrical contact exposed from the second surface of the substrate; and
a circuit layer disposed on the second surface of the substrate and electrically connected to the electrical contact of the photo detector;
wherein the substrate further comprises a through-silicon via (TSV) to electrically connect the light emitting devices to the circuit layer.

20. The optical device of claim 19, wherein the photo detector is a PIN diode.

21. The optical device of claim 20, wherein the PIN diode includes a n-type region adjacent to the first surface of the substrate and a p-type region adjacent to the second surface of the substrate.

22. The optical device of claim 19, further comprising a protection layer disposed on the first surface of the substrate and covering the light emitting devices.

23. The optical device of claim 19, wherein the circuit layer comprises a plurality of transistors.

24. The optical device of claim 19, wherein the light emitting devices include a first light emitting diode (LED), a second LED and a third LED, and respective widths of the first LED, the second LED and the third LED are different from each other.

25. The optical device of claim 24, wherein the first LED, the second LED and the third LED comprise a pixel that is adjacent to the photo detector.

26. The optical device of claim 19, wherein the light emitting devices include a plurality nanowire LEDs.

\* \* \* \* \*